United States Patent
Chen

(10) Patent No.: US 12,176,895 B2
(45) Date of Patent: Dec. 24, 2024

(54) APPARATUS AND METHOD FOR GENERATING DUMMY SIGNAL THAT HAS TRANSITIONS CONSTRAINED TO OCCUR WITHIN TRANSITION ENABLE WINDOWS SET BY DETECTION OF MORE THAN TWO CONSECUTIVE IDENTICAL DIGITS IN SERIAL DATA

(71) Applicant: Airoha Technology (HK) Limited, North Point (HK)

(72) Inventor: Huan-Sheng Chen, Hsinchu County (TW)

(73) Assignee: Airoha Technology (HK) Limited, North Point (HK)

( * ) Notice: Subject to any disclaimer, the term of this patent is extended or adjusted under 35 U.S.C. 154(b) by 303 days.

(21) Appl. No.: 17/715,049

(22) Filed: Apr. 7, 2022

(65) Prior Publication Data
US 2023/0327670 A1    Oct. 12, 2023

(51) Int. Cl.
| | |
|---|---|
| H04B 17/00 | (2015.01) |
| G06F 13/42 | (2006.01) |
| H03K 5/133 | (2014.01) |
| H03K 19/0175 | (2006.01) |
| H04L 1/24 | (2006.01) |

(52) U.S. Cl.
CPC . *H03K 19/017545* (2013.01); *G06F 13/4282* (2013.01); *H03K 5/133* (2013.01); *H04L 1/242* (2013.01)

(58) Field of Classification Search
CPC .... H03K 17/04206; H03K 17/56; G05F 1/10; G05F 1/56; H04L 7/0331; H03L 7/095; H03L 7/0807
USPC ........................................................ 375/227
See application file for complete search history.

(56) References Cited

U.S. PATENT DOCUMENTS

| | | |
|---|---|---|
| 4,502,143 A | 2/1985 | Kato |
| 8,130,124 B2 | 3/2012 | Bohm |
| 9,716,508 B1 | 7/2017 | Zhang |
| 10,790,809 B1 * | 9/2020 | Nuttgens ................. H03K 17/16 |
| 2009/0121790 A1 * | 5/2009 | Brown ................. H03G 3/3042 327/60 |
| 2010/0228508 A1 * | 9/2010 | Smith ................. G01R 13/0254 702/68 |
| 2013/0202112 A1 * | 8/2013 | Bernard ............. H04Q 11/0067 380/287 |
| 2023/0026005 A1 * | 1/2023 | Kim .................. H04L 25/03885 |

* cited by examiner

*Primary Examiner* — Khai Tran
(74) *Attorney, Agent, or Firm* — Winston Hsu

(57) ABSTRACT

A dummy signal generation circuit includes a consecutive identical digit (CID) detection circuit and a dummy transition circuit. The CID detection circuit detects occurrence of N CIDs in serial data, and sets a transition enable window in response to each sequence of N CIDs in the serial data, where N is a positive integer not smaller than 3. The dummy transition circuit generates a dummy signal that has transitions constrained to occur within transition enable windows set by the CID detection circuit.

14 Claims, 10 Drawing Sheets

APPARATUS AND METHOD FOR GENERATING DUMMY SIGNAL THAT HAS TRANSITIONS CONSTRAINED TO OCCUR WITHIN TRANSITION ENABLE WINDOWS SET BY DETECTION OF MORE THAN TWO CONSECUTIVE IDENTICAL DIGITS IN SERIAL DATA

BACKGROUND OF THE INVENTION

1. Field of the Invention

The present invention relates to dummy signal generation, and more particularly, to an apparatus and method for generating a dummy signal that has transitions constrained to occur within transition enable windows set by detection of more than two consecutive identical digits in serial data.

2. Description of the Prior Art

Regarding a data processing circuit powered by a supply voltage, the supply voltage has small fluctuation during a period in which a data output of the data processing circuit has dense data toggling between "1" and "0". However, serious power fluctuation occurs when the data output of the data processing circuit is switched from dense data toggling to consecutive identical digits (CIDs). It takes along time for the fluctuating supply voltage to become stable again. The fluctuating supply voltage leads to either jitter performance degradation or timing margin decrease. A conventional solution reduces the data-dependent power noise at the expense of large extra power consumption. Thus, there is a need for an innovative data-dependent power noise reduction design with lower power consumption overhead.

SUMMARY OF THE INVENTION

One of the objectives of the claimed invention is to provide an apparatus and method for generating a dummy signal that has transitions constrained to occur within transition enable windows set by detection of more than two consecutive identical digits in serial data.

According to a first aspect of the present invention, an exemplary dummy signal generation circuit is disclosed. The exemplary dummy signal generation circuit includes a consecutive identical digit (CID) detection circuit and a dummy transition circuit. The CID detection circuit is arranged to detect occurrence of N CIDs in serial data, and set a transition enable window in response to each sequence of N CIDs in the serial data, where N is a positive integer not smaller than 3. The dummy transition circuit is arranged to generate a dummy signal that has transitions constrained to occur within transition enable windows set by the CID detection circuit.

According to a second aspect of the present invention, an exemplary dummy signal generation method is disclosed. The exemplary dummy signal generation method includes: detecting occurrence of N consecutive identical digits (CIDs) in serial data, and setting a transition enable window in response to each sequence of N CIDs in the serial data, where N is a positive integer not smaller than 3; and generating a dummy signal that has transitions constrained to occur within transition enable windows.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
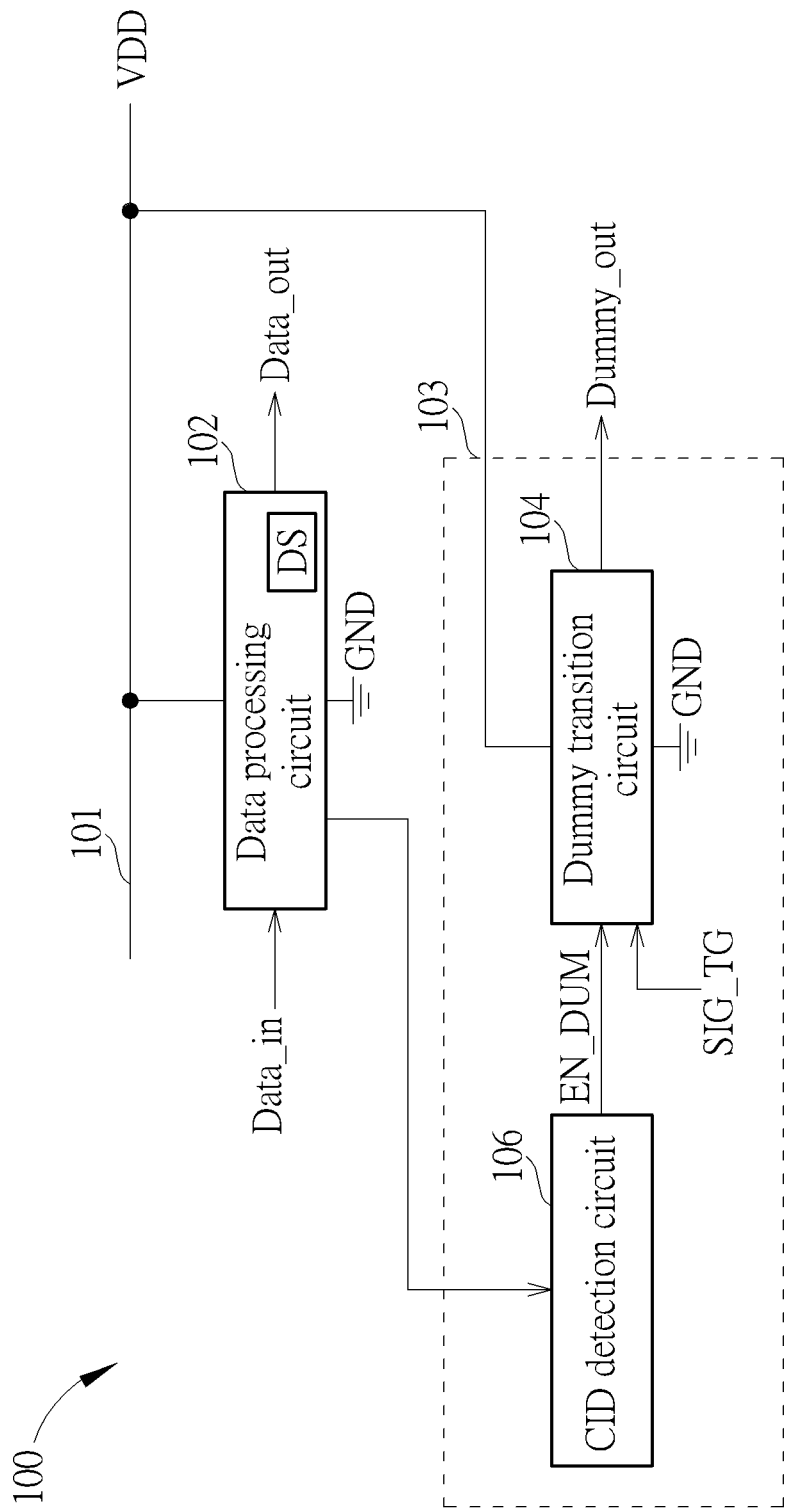
FIG. 1 is a diagram illustrating a data processing system with data-dependent power noise reduction according to an embodiment of the present invention.

FIG. 1 is a diagram illustrating a data processing system with data-dependent power noise reduction according to an embodiment of the present invention. The data processing system 100 includes a data processing circuit 102 and a dummy signal generation circuit 103. Regarding the dummy signal generation circuit 103, it includes a dummy transition circuit 104 and a consecutive identical digit (CID) detection circuit 106. The data processing circuit 102 is arranged to receive a data input signal Data_in, derive serial data (which is a time series of data bits) DS from the data input signal Data_in, and output a data output signal Data_out that carries the serial data DS to a following processing stage. Each of the data processing circuit 102 and the dummy transition circuit 104 is coupled between a supply voltage VDD and a ground voltage GND. Hence, both of the data processing circuit 102 and the dummy transition circuit 104 are coupled to the same power rail 101 for obtaining the supply voltage VDD. As mentioned above, serious power fluctuation occurs when a data output is switched from dense data toggling to CIDs. To mitigate the power fluctuation resulting from CIDs in the data output, the present invention proposes using the dummy transition circuit 104 to generate a dummy signal Dummy_out for intentionally introducing a transition (e.g. toggling from "0" to "1" or from "1" to "0") at a specific clock edge where the data output signal Data_out keeps its logic state "0" or "1" unchanged. In this embodiment, the specific clock edge is within a transition enable window set by CID detection. It should be noted that the dummy signal Dummy_out is generated for data-dependent power noise reduction, and is not needed to be transmitted to a following processing stage.

Considering a case where the CID detection circuit 106 is disabled, the dummy transition circuit 104 may generate the dummy signal Dummy_out with one transition introduced at any clock edge where the data output signal Data_out keeps its logic state "0" or "1" unchanged, such that the combination of the data output signal Data_out and the dummy signal Dummy_out have one transition at each clock edge, that is, 100% transition density. More specifically, at each clock edge, there is always one transition (e.g. toggling from "0" to "1" or from "1" to "0") occurring at either the data output signal Data_out or the dummy signal Dummy_out, which results in large extra power consumption. To address this power consumption overhead issue, the present invention proposes using the CID detection circuit 106 to generate a control signal EN_DUM indicative of transition enable windows that decide when the dummy signal Dummy_out is allowed to have transitions (i.e. data toggling). For example, the CID detection circuit 106 is arranged to detect occurrence of N CIDs in the serial data DS to be output, and set a transition enable window in response to each sequence of N CIDs in the serial data DS, where N is a positive integer not smaller than 3 (i.e. N≥3). In some embodiments, the CID detection circuit 106 may detect the occurrence of CIDs≥3 or CIDs≥4 in the serial data DS that will be transmitted via the data output signal Data_out.

The dummy transition circuit 104 may receive the control signal EN_DUM and a toggling signal SIG_TG (e.g. a clock signal), and may only pass the toggling signal SIG_TG to its output port during the transition enable windows indicated by the control signal EN_DUM, for creating transitions in the dummy signal Dummy_out. Hence, the dummy transition circuit 104 generates the dummy signal Dummy_out that has transitions constrained to occur within transition enable windows set by the CID detection circuit 106. Since each transition enable window is set by occurrence of N CIDs (N≥3), the dummy signal Dummy_out does not necessarily have one transition introduced at any clock edge where the data output signal Data_out keeps its logic state "0" or "1" unchanged. The dummy transition circuit 104 therefore has low extra power consumption. It should be noted that the data processing system 100 still has good power noise reduction performance due to the use of dummy signal Dummy_out.

For better comprehension of technical features of the proposed data-dependent power noise reduction design, several examples are described in detail as below with reference to the accompanying drawings.

Figure 2:
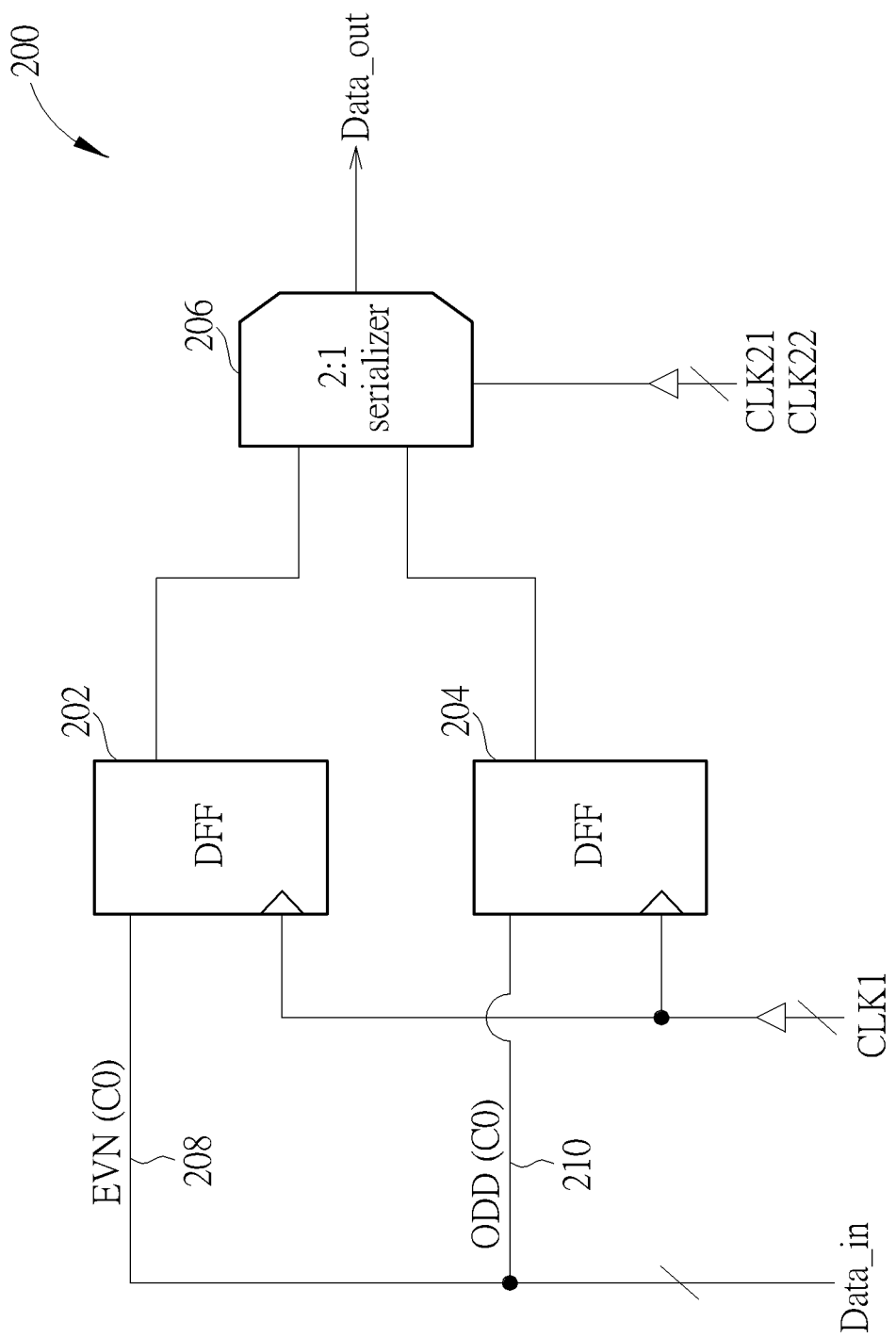
FIG. 2 is a diagram illustrating a data processing circuit that supports internal half-rate data processing according to an embodiment of the present invention.

In some applications, the data processing circuit 102 may have internal circuit components operating at a lower clock rate compared to the data rate of the serial data DS. FIG. 2 is a diagram illustrating a data processing circuit that supports internal half-rate data processing according to an embodiment of the present invention. The data processing circuit 102 shown in FIG. 1 may be implemented by the data processing circuit 200 shown in FIG. 2. In this embodiment, the data processing circuit 200 includes a plurality of D-type flip-flops (DFFs) 202, 204 and a 2:1 serializer 206. The data input signal Data_in is a half-rate data input, and is provided in parallel over two paths 208 and 210 which are separated within the data processing circuit 200, where one half of data is provided over one path, and the other half of data is provided over the other path. Specifically, data bits of the serial data DS may be separated so that consecutive bits are provided to different paths in an interleaving manner. For example, each bit of the half-rate data input EVN (C0) on one path 208 is an even bit of the serial data DS to be output via the data output signal Data_out, and each bit of the half-rate data input ODD (C0) on the other path 210 is an odd bit of the serial data DS to be output via the data output signal Data_out. The half-rate data inputs EVN (C0) and ODD (C0) may be retimed by DFFs 202 and 204, respectively, at the same edge of a half-rate clock CLK1. It should be noted that the retiming by DFFs 202 and 204 may be optional. The retimed half-rate data inputs EVN (C0) and ODD (C0) output from the DFFs 202 and 204 may be serialized by the 2:1 serializer 206, using multi-phase clocks CLK21 and CLK22 having the same clock rate (e.g. half rate) but different phases, to generate the data output signal Data_out at the full rate. In other words, the serial data DS is transmitted over the data output signal Data_out that is a full-rate data output derived from the half-rate data inputs EVN (C0) and ODD (C0).

In a case where the data processing circuit 102 is implemented by the data processing circuit 200, the CID detection circuit 106 may detect occurrence of CIDs≥3 (i.e. N CIDs, where N≥3) according to the half-rate data inputs EVN (C0), ODD (C0) and time-shifted versions of the half-rate data inputs EVN (C0), ODD (C0). It should be noted that a time-shifted version of a data input may be a delayed version of the data input or an advanced version of the data input, depending upon actual design considerations.

Figure 3:
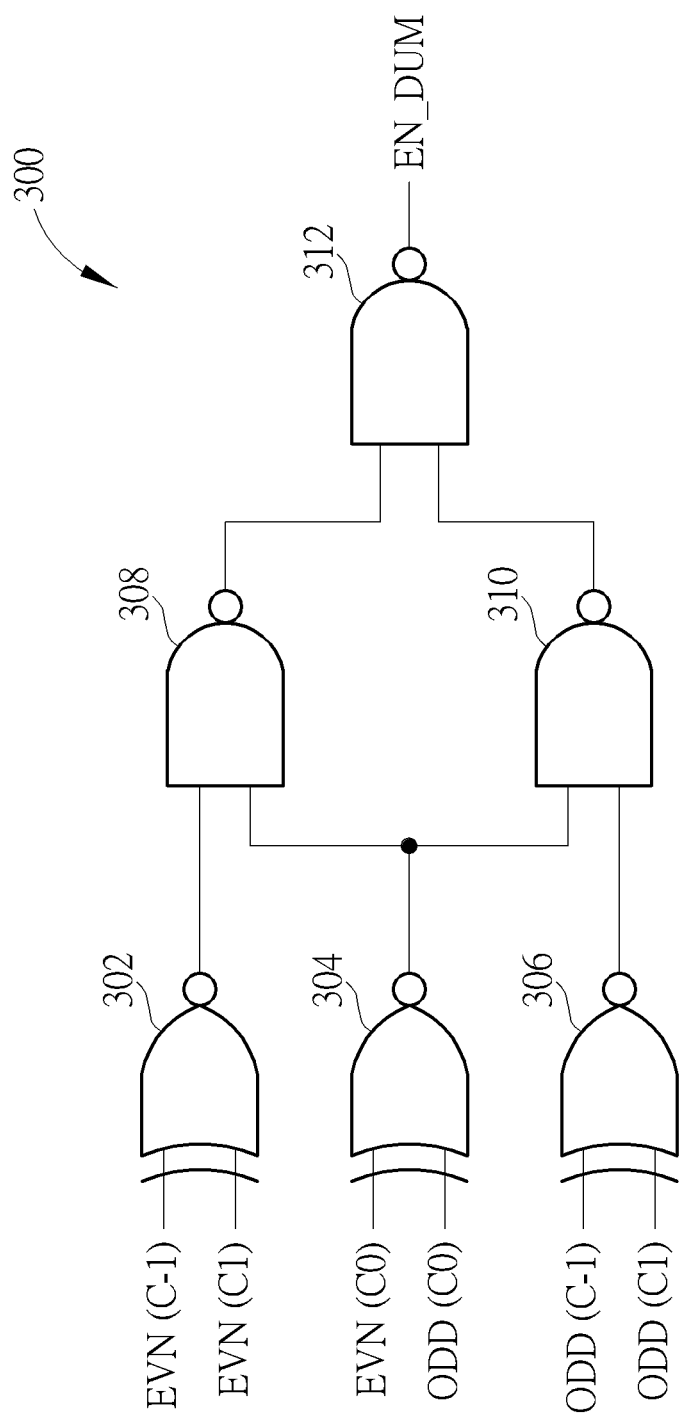
FIG. 3 is a diagram illustrating a consecutive identical digit (CID) detection circuit for generating a control signal that enables a following dummy transition circuit to generate dummy transitions only when CIDs≥3 according to an embodiment of the present invention.

FIG. 3 is a diagram illustrating a CID detection circuit for generating a control signal that enables a following dummy transition circuit to generate dummy transitions only when CIDs≥3 according to an embodiment of the present invention. The CID detection circuit 106 shown in FIG. 1 may be implemented by the CID detection circuit 300 shown in FIG. 3. In this embodiment, the CID detection circuit 300 is a combinational logic circuit designed for detection of CIDs≥3, and includes a plurality of XNOR gates 302, 304, 306 and a plurality of NAND gates 308, 310, 312. The XNOR gate 302 is arranged to perform an XNOR operation upon a delayed version of half-rate data input EVN (C0), labeled by EVN (C1), and an advanced version of half-rate data input EVN (C0), labeled by EVN (C−1). The XNOR gate 304 is arranged to perform an XNOR operation upon the half-rate data inputs EVN (C0) and ODD (C0). The XNOR gate 306 is arranged to perform an XNOR operation upon a delayed version of half-rate data input ODD (C0), labeled by ODD (C1), and an advanced version of half-rate data input ODD (C0), labeled by ODD (C−1). The control signal EN_DUM output from the NAND gate 312 is indicative of transition enable windows each corresponding to one sequence of N CIDs (N≥3) in the serial data DS to be output.

Figure 4:
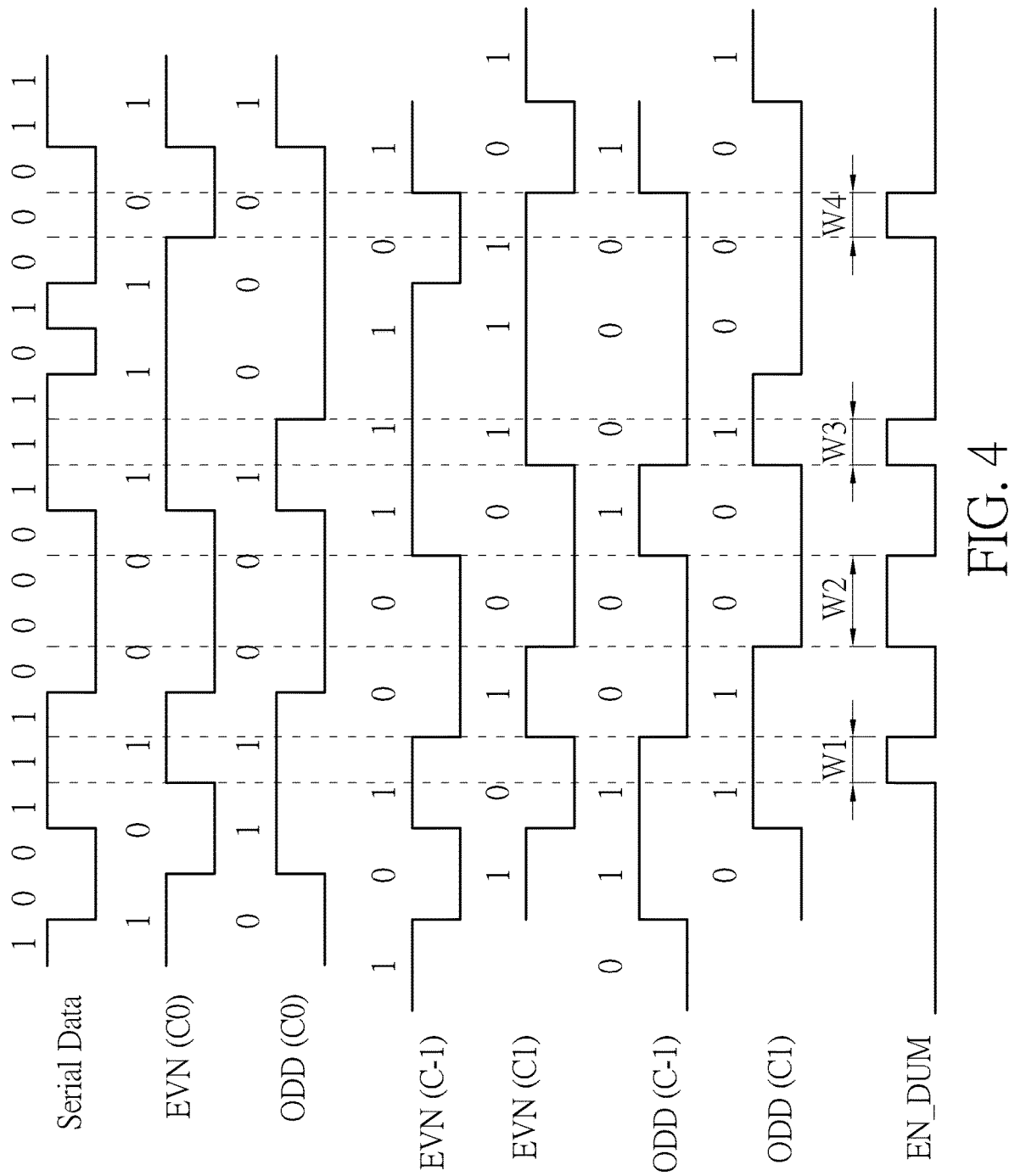
FIG. 4 is a timing diagram illustrating signals involved in generation of the control signal output from the CID detection circuit shown in FIG. 3.

Please refer to FIG. 4 in conjunction with FIG. 3. FIG. 4 is a timing diagram illustrating signals involved in generation of the control signal EN_DUM output from the CID detection circuit 300 shown in FIG. 3. As mentioned above, the CID detection circuit 300 is a combinational logic circuit designed for detection of CIDs≥3. Hence, a transition enable window W1 is set by the CID detection circuit 300 in response to a sequence of 3 consecutive 1's, a transition enable window W2 is set by the CID detection circuit 300 in response to a sequence of 4 consecutive 0's, a transition enable window W3 is set by the CID detection circuit 300 in response to a sequence of 3 consecutive 1's, and a transition enable window W4 is set by the CID detection circuit 300 in response to a sequence of 3 consecutive 0's.

The circuit design shown in FIG. 3 is for illustrative purposes only, and is not meant to be a limitation of the present invention. The CID detection circuit 106 is arranged to detect occurrence of N CIDs (N≥3) in the serial data DS to be output, and set a transition enable window in response to each sequence of N CIDs (N≥3) in the serial data DS. The circuit design of CID detection under a half-rate scenario may vary, depending upon the value of N.

In another case where the data processing circuit 102 is implemented by the data processing circuit 200, the CID detection circuit 106 may detect occurrence of CIDs≥4 (i.e. NCIDs, where N≥4) according to the half-rate data inputs EVN (C0), ODD (C0) and time-shifted versions of the half-rate data inputs EVN (C0), ODD (C0). It should be noted that a time-shifted version of a data input may be a delayed version of the data input or an advanced version of the data input, depending upon actual design considerations.

Figure 5:
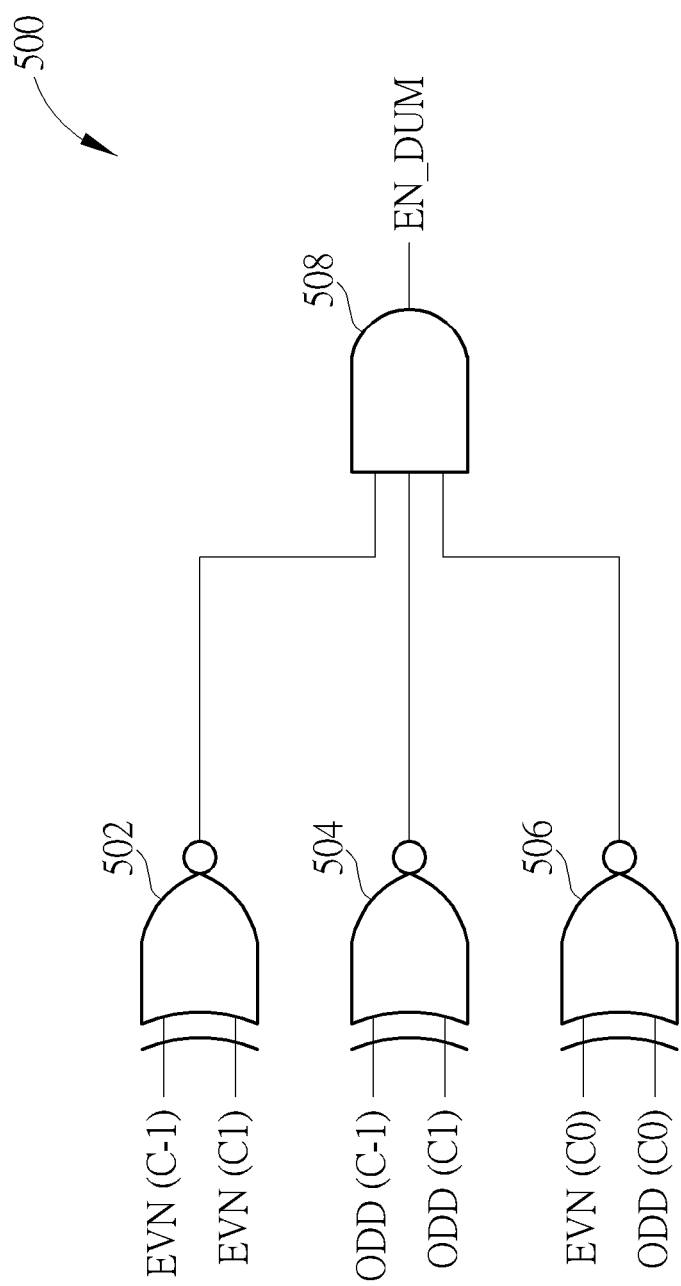
FIG. 5 is a diagram illustrating a CID detection circuit for generating a control signal that enables a following dummy transition circuit to generate dummy transitions only when CIDs≥4 according to an embodiment of the present invention.

FIG. 5 is a diagram illustrating a CID detection circuit for generating a control signal that enables a following dummy transition circuit to generate dummy transitions only when CIDs≥4 according to an embodiment of the present invention. The CID detection circuit 106 shown in FIG. 1 may be implemented by the CID detection circuit 500 shown in FIG. 5. In this embodiment, the CID detection circuit 500 is a combinational logic circuit designed for detection of CIDs≥4, and includes a plurality of XNOR gates 502, 504, 506 and an AND gate 508. The XNOR gate 502 is arranged to perform an XNOR operation upon a delayed version of half-rate data input EVN (C0), labeled by EVN (C1), and an advanced version of half-rate data input EVN (C0), labeled by EVN (C−1). The XNOR gate 504 is arranged to perform an XNOR operation upon a delayed version of half-rate data input ODD (C0), labeled by ODD (C1), and an advanced version of half-rate data input ODD (C0), labeled by ODD (C−1). The XNOR gate 506 is arranged to perform an XNOR operation upon the half-rate data inputs EVN (C0) and ODD (C0). The control signal EN_DUM output from the AND gate 508 is indicative of transition enable windows each corresponding to one sequence of N CIDs (N≥4) in the serial data DS to be output.

Figure 6:
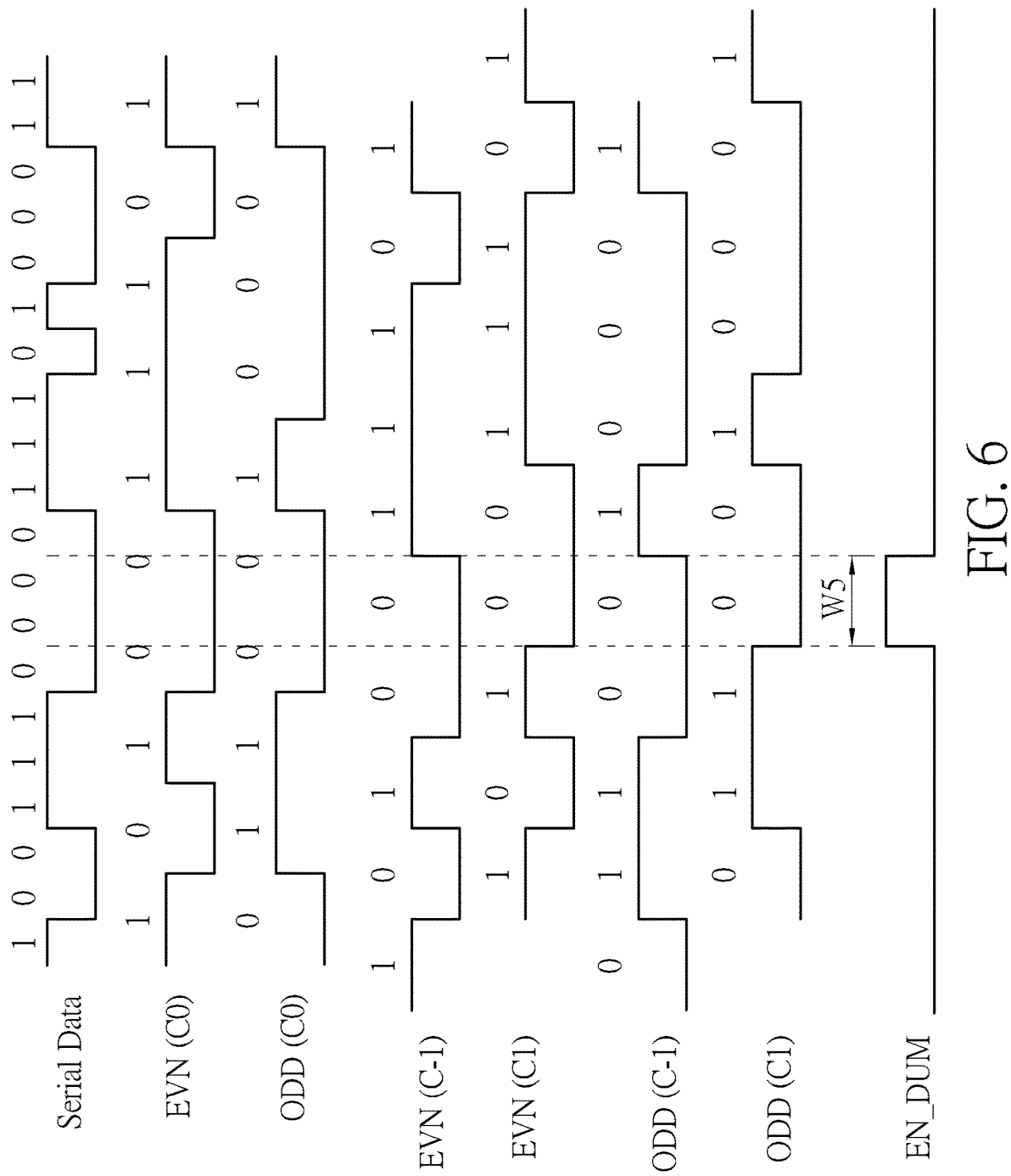
FIG. 6 is a timing diagram illustrating signals involved in generation of the control signal output from the CID detection circuit shown in FIG. 5.

Please refer to FIG. 6 in conjunction with FIG. 5. FIG. 6 is a timing diagram illustrating signals involved in generation of the control signal EN_DUM output from the CID detection circuit 500 shown in FIG. 5. As mentioned above, the CID detection circuit 500 is a combinational logic circuit designed for detection of CIDs≥4. Hence, a transition enable window W5 is set by the CID detection circuit 500 in response to a sequence of 4 consecutive 0's.

In above embodiments, the proposed data-dependent power noise reduction design can utilize two half-rate data inputs and certain time-shifted versions of half-rate data inputs for CID detection and dummy transition control. However, this is for illustrative purposes only, and is not meant to be a limitation of the present invention. In other embodiments, the proposed data-dependent power noise reduction design may utilize four quarter-rate data inputs and certain time-shifted versions of quarter-rate data inputs for CID detection and dummy transition control.

Figure 7:
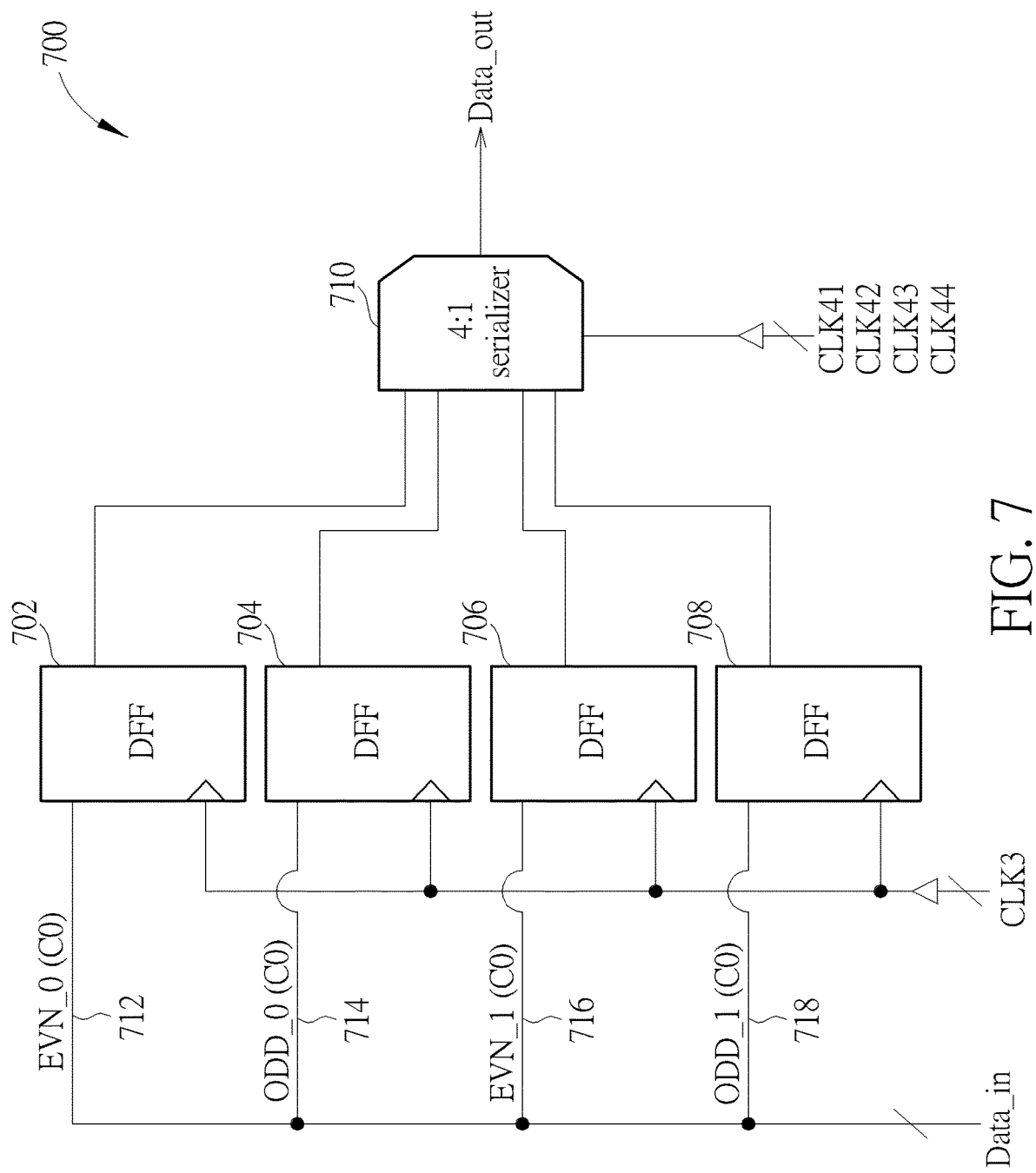
FIG. 7 is a diagram illustrating a data processing circuit that supports internal quarter-rate data processing according to an embodiment of the present invention.

FIG. 7 is a diagram illustrating a data processing circuit that supports internal quarter-rate data processing according to an embodiment of the present invention. The data processing circuit 102 shown in FIG. 1 may be implemented by the data processing circuit 700 shown in FIG. 7. In this embodiment, the data processing circuit 700 includes a plurality of DFFs 702, 704, 706, 708 and a 4:1 serializer 710. The data input signal Data_in is a quarter-rate data input, and is provided in parallel over four paths 712, 714, 716, and 718 which are separated within the data processing circuit 700, where a first quarter of data is provided over a first path, a second quarter of data is provided over a second path, a third quarter of data is provided over a third path, and a fourth quarter of data is provided over a fourth path. Specifically, data bits of the serial data DS may be separated so that consecutive bits are provided to different paths in an interleaving manner. For example, each bit of the quarter-rate data input EVN_0 (C0) on path 712 and the quarter-rate data input EVN_1 (C0) on path 716 is an even bit of the serial data DS to be output via the data output signal Data_out, and each bit of the quarter-rate data input ODD_0 (C0) on path 714 and the quarter-rate data input ODD_1 (C0) on path 718 is an odd bit of the serial data DS to be output via the data output signal Data_out. The quarter-rate data inputs EVN_0 (C0), ODD_0 (C0), EVN_1 (C0), ODD_1 (C0) may be retimed by DFFs 702-708, respectively, at the same edge of a quarter-rate clock CLK3. It should be noted that the retiming by DFFs 702-708 may be optional. The retimed quarter-rate data inputs EVN_0 (C0), ODD_0 (C0), EVN_1 (C0), ODD_1 (C0) output from the DFFs 702-708 may be serialized by the 4:1 serializer 710, using multi-phase clocks CLK41, CLK42, CLK43, CLK44 having the same clock rate (e.g. quarter rate) but different phases, to generate the data output signal Data_out at the full rate. In other words, the serial data DS is transmitted over the data output signal Data_out that is a full-rate data output derived from the quarter-rate data inputs EVN_0 (C0), ODD_0 (C0), EVN_1 (C0), ODD_1 (C0).

Figure 8:
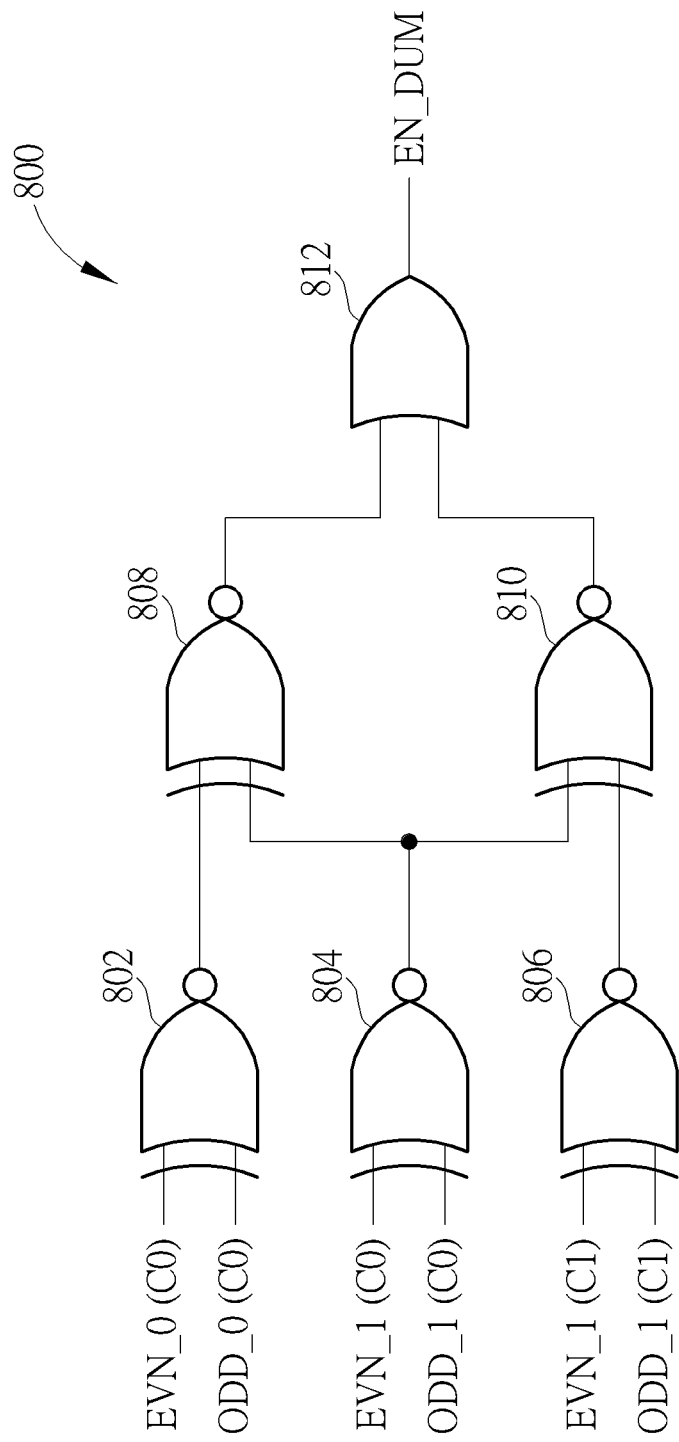
FIG. 8 is a diagram illustrating another CID detection circuit for generating a control signal that enables a following dummy transition circuit to generate dummy transitions only when CIDs≥4 according to an embodiment of the present invention.

In a case where the data processing circuit 102 is implemented by the data processing circuit 700, the CID detection circuit 106 may detect occurrence of CIDs≥4 (i.e. NCIDs, where N≥4) according to the quarter-rate data inputs EVN_0 (C0), ODD_0 (C0), EVN_1 (C0), ODD_1 (C0) and time-shifted versions of data inputs selected from the quarter-rate data inputs EVN_0 (C0), ODD_0 (C0), EVN_1 (C0), ODD_1 (C0). FIG. 8 is a diagram illustrating another CID detection circuit for generating a control signal that enables a following dummy transition circuit to generate dummy transitions only when CIDs≥4 according to an embodiment of the present invention. The CID detection circuit 106 shown in FIG. 1 may be implemented by the CID detection circuit 800 shown in FIG. 8. In this embodiment, the CID detection circuit 800 is a combinational logic circuit designed for detection of CIDs≥4, and includes a plurality of XNOR gates 802, 804, 806, 808, 810 and an OR gate 812. The XNOR gate 802 is arranged to perform an XNOR operation upon the quarter-rate data inputs EVN_0 (C0) and ODD_0 (C0). The XNOR gate 804 is arranged to perform an XNOR operation upon the quarter-rate data inputs EVN_1 (C0) and ODD_1 (C0). The XNOR gate 806 is arranged to perform an XNOR operation upon a delayed version of quarter-rate data input EVN_1 (C0), labeled by EVN_1 (C1), and a delayed version of quarter-rate data input ODD_1 (C0), labeled by ODD_1 (C1). The control signal EN_DUM output from the OR gate 812 is indicative of transition enable windows each corresponding to one sequence of N CIDs (N≥4) in the serial data DS to be output.

Figure 9:
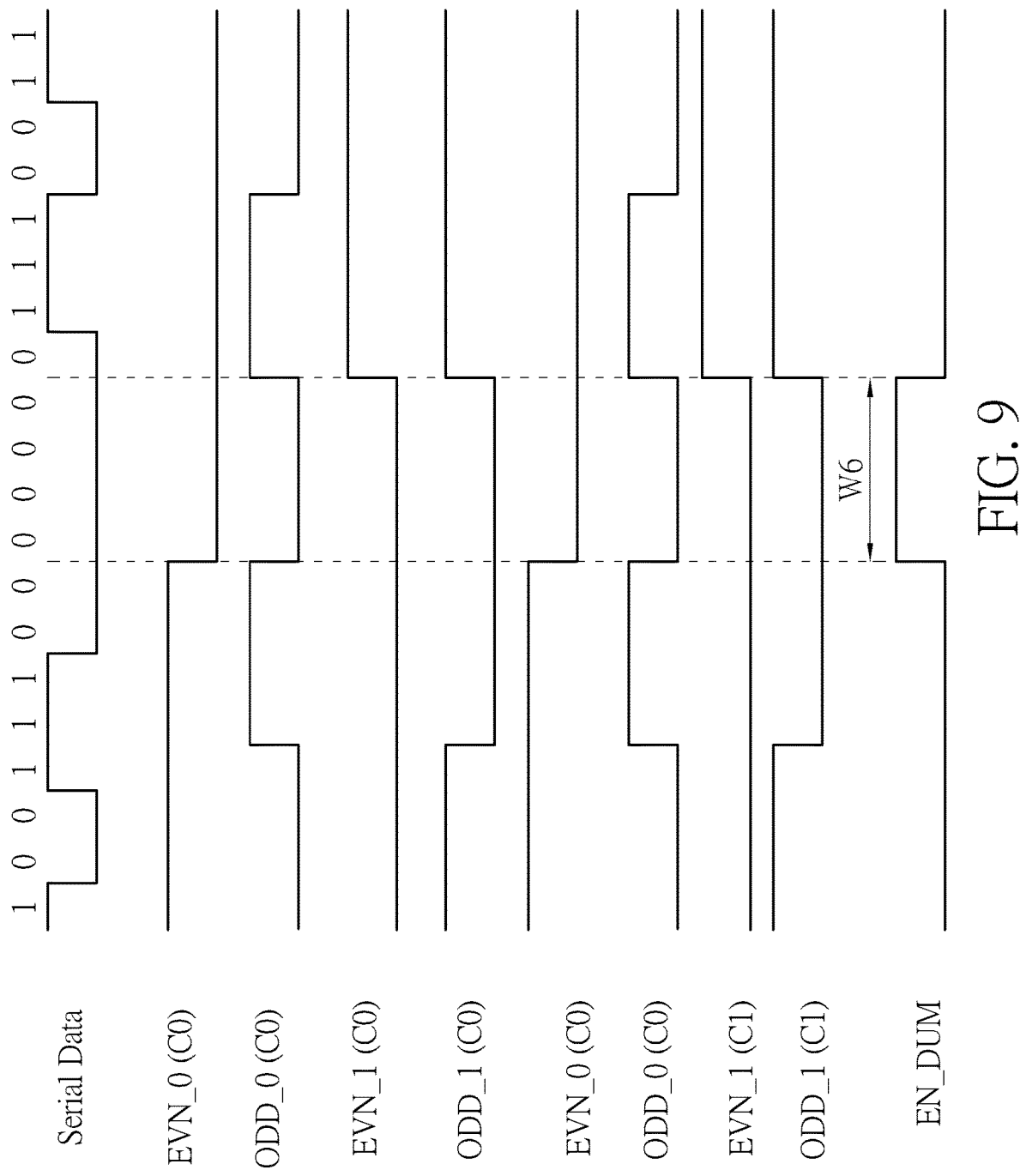
FIG. 9 is a timing diagram illustrating signals involved in generation of the control signal output from the CID detection circuit shown in FIG. 8.

Please refer to FIG. 9 in conjunction with FIG. 8. FIG. 9 is a timing diagram illustrating signals involved in generation of the control signal EN_DUM output from the CID detection circuit 800 shown in FIG. 8. As mentioned above, the CID detection circuit 800 is a combinational logic circuit designed for detection of CIDs≥4. Hence, a transition enable window W6 is set by the CID detection circuit 800 in response to a sequence of 7 consecutive 1's.

The circuit design shown in FIG. 8 is for illustrative purposes only, and is not meant to be a limitation of the present invention. The CID detection circuit 106 is arranged to detect occurrence of N CIDs (N≥3) in the serial data DS to be output, and set a transition enable window in response to each sequence of N CIDs (N≥3) in the serial data DS. The circuit design of CID detection under a quarter-rate scenario may vary, depending upon the value of N. For example, considering a case where the data processing circuit 102 is implemented by the data processing circuit 700, the CID detection circuit 106 may be used to detect occurrence of CIDs≥3 (i.e. N CIDs, where N≥3) according to the quarter-rate data inputs EVN_0 (C0), ODD_0 (C0), EVN_1 (C0), ODD_1 (C0) and time-shifted versions of data inputs selected from the quarter-rate data inputs EVN_0 (C0), ODD_0 (C0), EVN_1 (C0), ODD_1 (C0). Similar description is omitted here for brevity.

To address the power consumption overhead issue caused by 100% transition density, the present invention proposes using the CID detection circuit 106 to generate the control signal EN_DUM (which is indicative of transition enable windows in which dummy transitions are allowed to be generated) by detecting occurrence of N CIDs (N≥3) in the serial data DS to be output via the data output signal Data_out. To further reduce the power consumption of dummy transition generation, the present invention proposes using a dummy transition circuit with scalable output driving capability.

Figure 10:
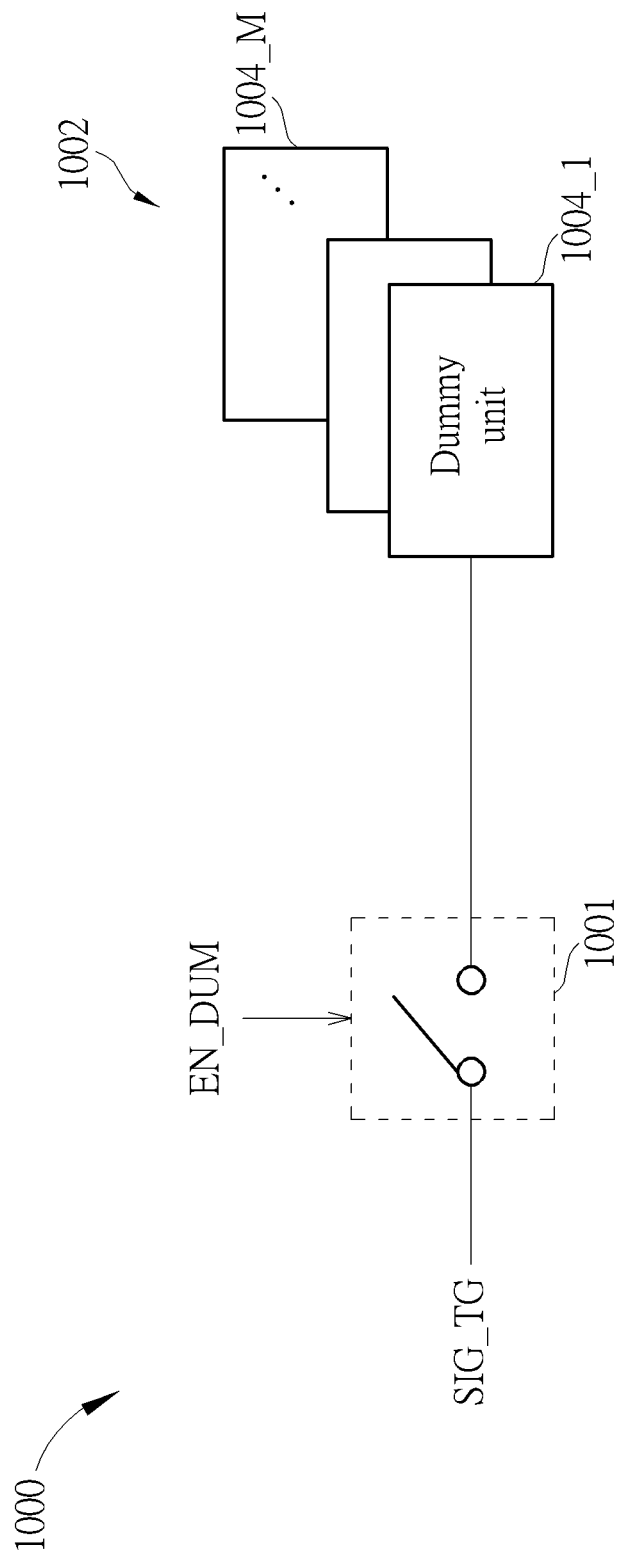
FIG. 10 is a diagram illustrating a dummy transition circuit with scalable output driving capability according to an embodiment of the present invention.

FIG. 10 is a diagram illustrating a dummy transition circuit with scalable output driving capability according to an embodiment of the present invention. The dummy transition circuit 104 shown in FIG. 1 may be implemented by the dummy transition circuit 1000 shown in FIG. 10. The dummy transition circuit 1000 includes a transition control element 1001 and a scalable dummy unit array 1002. The transition control element 1001 forwards transitions of the toggling signal SIG_TG (e.g. a clock signal) to the scalable dummy unit array 1002 during a period in which the control signal EN_DUM has a first logic level (e.g. "1") due to a transition enable window, and blocks transitions of the toggling signal SIG_TG from arriving at the scalable dummy unit array 1002 when the control signal EN_DUM has a second logic level (e.g. "0"). Byway of example, but not limitation, the transition control element 1001 may be a switch circuit or a clock gating circuit.

Regarding the scalable dummy unit array 1002, it includes a plurality of dummy units 1004_1-1104_M, where M is a positive integer not smaller than 2. For example, each of the dummy units 1004_1-1104_M may be an output driver circuit. The data output signal Data_out is used to transmit data bits of the serial data DS, and the dummy signal Dummy_out is used to add dummy transitions for data-dependent power noise reduction. The data output signal Data_out (i.e. serial data DS) is output from the data processing circuit 102 with first output driving capability. The dummy signal Dummy_out is output from the dummy transition circuit 1000 with second output driving capability. The second output driving capability may be the same as or different from (e.g. lower than) the first output driving capability, depending upon actual application requirements. In this embodiment, the dummy signal Dummy_out is output from the dummy transition circuit 1000 with output driving capability set by the scalable dummy unit array 1002. Specifically, the number of enabled dummy units in the scalable dummy unit array 1002 decides intensity of the output driving current for setting the dummy signal Dummy_out generated at an output port of the dummy transition circuit 1000. For example, when all of the dummy units 1004_1-1104_M are enabled, the output driving capability of the dummy transition circuit 1000 may be the same as the output driving capability of the data processing circuit 102. For another example, when only a portion of the dummy units 1004_1-1104_M are enabled, the output driving capability of the dummy transition circuit 1000 may be lower than the output driving capability of the data processing circuit 102.

There is tradeoff between power consumption and power ripple reduction. When all of the dummy units 1004_1-1104_M are enabled, there is large power consumption, but smaller power ripple. When only a portion of the dummy units 1004_1-1104_M are enabled, there is smaller power consumption, but larger power ripple. Regarding a low-power application, the dummy transition circuit 1000 may reduce the number of enabled dummy units for achieving data-dependent power noise reduction with much lower power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dummy signal generation circuit comprising:
    a consecutive identical digit (CID) detection circuit, arranged to detect occurrence of N CIDs in serial data, and set a transition enable window in response to each sequence of N CIDs in the serial data, where N is a positive integer not smaller than 3; and
    a dummy transition circuit, arranged to generate a dummy signal that has transitions constrained to occur within transition enable windows set by the CID detection circuit, wherein the dummy signal is not part of the serial data.

2. The dummy signal generation circuit of claim 1, wherein the serial data is a full-rate data output derived from a first half-rate data input and a second half-rate data input, each bit of one of the first half-rate data input and the second half-rate data input is an odd bit of the serial data, each bit of another of the first half-rate data input and the second half-rate data input is an even bit of the serial data, and the CID detection circuit is arranged to detect occurrence of N CIDs according to the first half-rate data input, the second half-rate data input, and time-shifted versions of the first half-rate data input and the second half-rate data input.

3. The dummy signal generation circuit of claim 1, wherein the serial data is a full-rate data output derived from a first quarter-rate data input, a second quarter-rate data input, a third quarter-rate data input, and a fourth quarter-rate data input, each bit of two of the first quarter-rate data input, the second quarter-rate data input, the third quarter-rate data input, and the fourth quarter-rate data input is an odd bit of the serial data, each bit of another two of the first quarter-rate data input, the second quarter-rate data input, the third quarter-rate data input, and the fourth quarter-rate data input is an even bit of the serial data, and the CID detection circuit is arranged to detect occurrence of N CIDs according to the first quarter-rate data input, the second quarter-rate data input, the third quarter-rate data input, the fourth quarter-rate data input, and time-shifted versions of data inputs selected from the first quarter-rate data input, the second quarter-rate data input, the third quarter-rate data input, and the fourth quarter-rate data input.

4. The dummy signal generation circuit of claim 1, wherein the serial data is output from a data processing circuit with first output driving capability, and the dummy signal is output from the dummy transition circuit with second output driving capability that is different from the first output driving capability.

5. The dummy signal generation circuit of claim 4, wherein the second output driving capability is lower than the first output driving capability.

6. The dummy signal generation circuit of claim 1, wherein the dummy transition circuit comprises:
a scalable dummy unit array, comprising a plurality of dummy units, wherein the dummy signal is output from the dummy transition circuit with output driving capability set by the scalable dummy unit array.

7. The dummy signal generation circuit of claim 6, wherein the output driving capability of the dummy transition circuit is set by enabling only a portion of the plurality of dummy units.

8. A dummy signal generation method comprising:
detecting occurrence of N consecutive identical digits (CIDs) in serial data, and setting a transition enable window in response to each sequence of N CIDs in the serial data, where N is a positive integer not smaller than 3; and
generating a dummy signal that has transitions constrained to occur within transition enable windows, wherein the dummy signal is not part of the serial data.

9. The dummy signal generation method of claim 8, wherein the serial data is a full-rate data output derived from a first half-rate data input and a second half-rate data input, each bit of one of the first half-rate data input and the second half-rate data input is an odd bit of the serial data, each bit of another of the first half-rate data input and the second half-rate data input is an even bit of the serial data, and detecting occurrence of N CIDs in the serial data comprises:
detecting occurrence of N CIDs according to the first half-rate data input, the second half-rate data input, and time-shifted versions of the first half-rate data input and the second half-rate data input.

10. The dummy signal generation method of claim 8, wherein the serial data is a full-rate data output derived from a first quarter-rate data input, a second quarter-rate data input, a third quarter-rate data input, and a fourth quarter-rate data input, each bit of two of the first quarter-rate data input, the second quarter-rate data input, the third quarter-rate data input, and the fourth quarter-rate data input is an odd bit of serial data, each bit of another two of the first quarter-rate data input, the second quarter-rate data input, the third quarter-rate data input, and the fourth quarter-rate data input is an even bit of the serial data, and detecting occurrence of N CIDs in the serial data comprises:
detecting occurrence of N CIDs according to the first quarter-rate data input, the second quarter-rate data input, the third quarter-rate data input, the fourth quarter-rate data input, and time-shifted versions of data inputs selected from the first quarter-rate data input, the second quarter-rate data input, the third quarter-rate data input, and the fourth quarter-rate data input.

11. The dummy signal generation method of claim 8, wherein the serial data is output from a data processing circuit with first output driving capability, and the dummy signal is output from a dummy transition circuit with second output driving capability that is different from the first output driving capability.

12. The dummy signal generation method of claim 11, wherein the second output driving capability is lower than the first output driving capability.

13. The dummy signal generation method of claim 8, wherein the dummy signal is output from a dummy transition circuit that comprises a scalable dummy unit array, the scalable dummy unit array comprises a plurality of dummy units; and the dummy signal generation method further comprises:
setting output driving capability of the dummy transition circuit through the scalable dummy unit array.

14. The dummy signal generation method of claim 13, wherein setting the output driving capability of the dummy transition circuit through the scalable dummy unit array comprises:
setting the output driving capability of the dummy transition circuit by enabling only a portion of the plurality of dummy units.

* * * * *